United States Patent
Conover et al.

(10) Patent No.: US 6,426,126 B1
(45) Date of Patent: *Jul. 30, 2002

(54) PREPARATION OF METAL COATINGS

(75) Inventors: Stephen P. Conover, Minneapolis, MN (US); Ashok K. Sharma, Delhi (IN)

(73) Assignee: AMT Holdings, Inc., Minnetonka, MN (US)

( * ) Notice: Subject to any disclaimer, the term of this patent is extended or adjusted under 35 U.S.C. 154(b) by 7 days.

This patent is subject to a terminal disclaimer.

(21) Appl. No.: 09/693,133

(22) Filed: Oct. 21, 2000

Related U.S. Application Data

(63) Continuation-in-part of application No. 09/216,450, filed on Dec. 18, 1998, now Pat. No. 6,136,389.
(60) Provisional application No. 60/068,115, filed on Dec. 19, 1997.

(51) Int. Cl.$^7$ .................................................. C08F 2/46
(52) U.S. Cl. .................... 427/488; 427/249.2; 427/252; 427/255.28; 427/576; 427/580
(58) Field of Search ................................ 427/576, 488, 427/580, 249.2, 252, 255.28

(56) References Cited

U.S. PATENT DOCUMENTS

| | | |
|---|---|---|
| 3,791,993 A | 2/1974 | Rostrup-Nielsen |
| 3,876,555 A | 4/1975 | Gryaznov et al. |
| 4,111,856 A | 9/1978 | Haag et al. |
| 4,544,470 A | 10/1985 | Hetrick |
| 4,571,290 A | 2/1986 | Ward et al. |
| 4,764,573 A | 8/1988 | Myers |
| 4,774,026 A | 9/1988 | Kitamori et al. |
| 4,863,608 A | 9/1989 | Kawai et al. |
| 4,868,127 A | 9/1989 | Blades et al. |
| 4,921,823 A | 5/1990 | Furneaux et al. |
| 4,966,665 A | 10/1990 | Ibusuki et al. |
| 5,045,288 A | 9/1991 | Raupp et al. |
| 5,069,885 A | 12/1991 | Ritchie |
| 5,096,745 A | 3/1992 | Anderson et al. |
| 5,118,422 A | 6/1992 | Cooper et al. |
| 5,126,111 A | 6/1992 | Al-Ekabi et al. |
| 5,137,607 A | 8/1992 | Anderson et al. |
| 5,183,788 A | 2/1993 | Jacobson et al. |
| 5,196,380 A | 3/1993 | Shadman |
| 5,210,059 A | 5/1993 | Matturo et al. |
| 5,211,984 A | 5/1993 | Wilson |
| 5,234,777 A | 8/1993 | Wilson |
| 5,395,522 A | 3/1995 | Melanson et al. |
| 5,407,699 A | 4/1995 | Myers |
| 5,439,652 A | 8/1995 | Sczechowski et al. |
| 5,468,699 A | 11/1995 | Zhang et al. |
| 5,525,436 A | 6/1996 | Savinell et al. |
| 5,525,570 A | 6/1996 | Chakraborty et al. |
| 5,569,633 A | 10/1996 | Carolan et al. |
| 5,601,945 A | 2/1997 | Clough |
| 5,616,532 A | 4/1997 | Heller et al. |
| 5,637,544 A | 6/1997 | Shadman |
| 5,652,020 A | 7/1997 | Collins et al. |

FOREIGN PATENT DOCUMENTS

JP 60-184652 9/1985

OTHER PUBLICATIONS

Yi–Ming Sun and Soon–Jai Khang, "Catalytic Membrane for Simultaneous Chemical Reaction and Separation Applied to a Dehydrogenation Reaction" *Ind. Eng. Chem. Res.* 1988, 27, 1136–1142. (No month avail.).

Uzio, et al. "Platinum/γ–Al$_2$O$_3$ Catalytic Membrane: Preparation, Morphological and Catalytic Characterizations", *Applied Catalysis* A: General, 96 (1993) 83–97. (No month avail.).

Huang et al. "Palladium Membranes Supported on Porous Ceramics Prepared by Chemical Vapor Deposition", *Thin Solid Films* 302 (1997), pp. 98–101. (No month avail.).

Ramachandra et al., "Oxidative Coupling of Methane in Porous Vycor Membrane Reactors", *Journal of Membrane Science*, 116 (1996) pp. 253–264. (No month avail.).

Champagnie, et al. "A High Temperature Catalytic Membrane Reactor for Ethane Dehydrogenation", *Chemical Engineering Science*, vol. 45, No. 8, pp. 2423–2429 (1990). (No month avail.).

Shu et al., "Catalytic Palladium–based Membrane Reactors: A Review", *The Canadian Journal of Chemical Engineering*, vol. 69, Oct., 1991, pp. 1036–1060.

*Primary Examiner*—Bernard Pianalto
(74) *Attorney, Agent, or Firm*—Haugen Law Firm PLLP

(57) ABSTRACT

A method for preparing thin films of noble metals upon porous substrate surfaces including utilizing plasma polymerization wherein the noble metals are derived from a monomer or comonomer precursor of the noble metal and with the precursor being disposed within a plasma glow zone to convert the precursor to its dissociated form, thereby allowing the substrate to receive a deposit of a substantially continuous noble metal film thereon. A wide variety of noble metals and their alloys may be treated in this fashion, including such noble metals as platinum, ruthenium, gold and certain alloys thereof.

40 Claims, No Drawings

PREPARATION OF METAL COATINGS

CROSS-REFERENCE TO RELATED APPLICATION

This is a continuation-in-part of our application Ser. No. 09/216,450, filed Dec. 18, 1998, entitled "PREPARATION OF METAL COATINGS" U.S. Pat. No. 6,136,389, which application is a utility application of that certain Provisional Application Ser. No. 60/068,115, filed Dec. 19, 1997 of Stephen P. Conover and Ashok K. Sharma, entitled "PREPARATION OF PLATINUM COATINGS THROUGH PLASMA POLYMERIZATION."

BACKGROUND OF THE INVENTION

The present invention relates generally to a system for the activation of precious metal containing monomers or comonomer precursors utilizing plasma polymerization techniques. The monomer or comonomer precursors are positioned within the glow zone for conversion to the dissociated form wherein the precursors are enriched with radicals, electrons and ions (i.e., plasma conversion), and deposited as a platinized coating. The platinized coating is further characterized by its being deposited as a plasma polymer or copolymer onto and/or into an appropriate substrate also disposed within the glow zone. Although a variety of substrates are useful, the plasma polymerization operation also preferably includes utilization of a porous electrically insulative substrate such as one consisting of glass. In accordance with the present invention, the entire process including each of the individual operations is undertaken at low temperatures, and specifically at or about room temperature. The features of the present invention permit these operations to be undertaken without need to heat either the source percursor or the substrates employed in the process.

Presently known methods utilized for making films of noble metals such as platinum, gold platinum, ruthenium and alloys such as platinum and palladium, or other precious metals or alloys including for example alloys of platinum/copper and platinum/tin do not appropriately and completely cover the entire surface of a porous structure including porous membranes, beads, aerogels, fibers, porous silicon, or others. The present invention is distinguishable inasmuch as it utilizes chemical vapor infiltration followed by low temperature, low energy plasma induced metallization for the application of continuous layers or films of precious metals and/or alloys. Conventional vapor state plasma discharge operations, for example, has been found to be ineffective for pore penetration of the films, and in particular is ineffective for use with a variety of platinum compounds. Additionally, the size of the particulate obtained from conventional vapor state plasma fails to be generally in nanometer dimensions.

In accordance with the present invention, an electrical discharge from an RF generator is applied to the external electrodes of a capacitively coupled tubular plasma reactor. The articles are initially pre-exposed to the vapors. Thereafter, the selected monomer or comonomer precursors are introduced along with a carrier gas into the reactor and energized into a plasma. The area of highest plasma energy density within the reactor is controllable, and typically controllably disposed in the area between the electrodes and the plasma glow zone.

While positioned within the plasma glow zone, the substrate is preferably rotated in order to allow the substrate to receive a uniform deposit of plasma polymer. As an alternate procedure, the electrodes may be moved to accommodate unusual configurations, such as elongated substrates or the like. In accordance with the present invention, it is not necessary that components be held at elevated temperatures, and hence the operations may proceed at low temperatures, such as at or about room temperature.

A preferred material for use in connection with the present invention is platinum (II) hexafluoroacetylacetonate. The hexafluoroacetylacetonate compound is commercially available and is further identified through CAS #65353-51-7 FW=609.22.

One system for the continuous production of the platinized glass substrate employs an RF plasma reactor of tubular configuration. This reactor employs a pair of capacitively coupled external electrodes positioned at either end of the reactor, and is externally coupled to an RF generator. The highest energy density is maintained in the area between the electrodes, that is, the plasma glow zone, by controlling both the current from the RF generator, the gas supporting the plasma, and optionally, the monomer or comonomer flow rate. In this situation, when the flow rate becomes too rapid, the glow zone will "spill over" to the region outside of the electrodes. On the other hand, if the flow rate is too slow, the plasma will fail to ignite or will fail to fill the entire inter-electrode region. The chambers employed are in vacuum-sealed relationship, and each is provided with an outlet to a vacuum pump. The reactor chamber may be formed of any material with sufficient resistance to withstand the plasma polymerization reaction condition. Preferably materials found suitable for this application are quartz, Pyrex™ and Vycor™. In addition, certain plastics have been found satisfactory as well as various ceramics.

Proper spacing between the electrodes in the plasma reactor depend upon the size of the reactor tube. One system which has been found useful employs electrodes approximately 10–15 centimeters apart, with the tube having a diameter of 25 mm. When larger diameter tubes are employed, the energy density associated with the plasma glow zone should be maintained as closely as possible to that in the smaller tubular reactor. Along with energy density, it is extremely important to control the density of the monomer as well as the density of the plasma carrier gas. In this instance, the monomer is platinum (II) hexafluoroacetylacetonate. Although monomer density will generally remain the same with changes in tube size, some variation in the optimum of both energy density and monomer density will result with changes in system size and design. In the system described herein, the current from the RF generator is preferably maintained at an appropriate level for the application. Depending upon the size and the configuration, those of skill in the art are able to ascertain the appropriate power level. Other conditions are as follows:

Frequency=13.56 Megahertz.

This frequency is appropriate for this application, and is authorized for use by the Federal Communications Commission. Other frequencies can be employed, particularly lower frequencies in the kilohertz range.

Methods for plasma generation between electrodes using an electric field are well known in the art. A DC field, or an AC field from 50 Hz to about 10 GHz are typical. Power values ranging from between about 1 watt to 5,000 watts are suitable.

A preferred electrical field generating means for plasma processing is the use of a high frequency power supply to initiate and sustain the plasma. The preferred operating frequency is 13.56 MHz. Other frequencies, such as 75 KHz are sometimes employed. The particular frequency and power values chosen depend on the deposition requirements of the coating materials and substrates.

Also well known in the art are potentially beneficial modifying means for increasing the ionization potential and/or providing improved spatial control of the plasma through the use of separate magnetic fields, i.e., electron cyclotron resonance (ECR) microwave plasma technique.

A useful guide in determining changes in reaction parameters with changes in tubular geometry is the composite discharge parameter W/FM, where "W" is the plasma wattage, "F" is the flow rate of the monomer or monomers, and "M", is the molecular weight of the monomer or monomers. As a tubular geometry and system size vary, W/FM may vary for a given plasma polymer or copolymer deposition rate, but optimum W/FM will vary between one-half to twice that of the original W/FM for a given monomer system. Therefore, for a given monomer system, changes in the composition plasma parameter with changes in tubular geometry may be expressed:

$$(\tfrac{1}{2}W_a/F_aM_a < W_b F_b M_b < (2) W_a/F_a M_a$$

where $W_b/F_b M_b$ is the complete plasma parameter for a first tubular RF tubular reactor as described herein, and where $W_a/F_a M_a$ is the composite plasma parameter for a differently sized tubular reactor as described herein.

While this reactor design has been found useful, other designs will, of course, be capable of application to the process as well.

The arrangement can readily be adapted to continuous production or treatment of flat films, discs, rods, tubes, filaments, beads, or other articles by providing a suitable reactor chamber with supply and take-up spools or fixtures to accommodate the workpieces.

DESCRIPTION OF THE PREFERRED EMBODIMENT

In accordance with the preferred embodiment of the present invention, platinized articles such as platinized membranes are formed utilizing porous articles such as glass and the like as the substrate. In addition to platinum compounds, other noble metal coatings may be prepared in a similar or related fashion. The operation includes the steps as set forth below.

After selection of the substrate, the surface of the substrate is cleaned. In this example, hollow glass tubes are employed, with these tubes being characterized as porous Vycor™ glass. Porous Vycor™ glass (thirsty glass) is initially treated to remove impurities which have been absorbed from contaminating vapors in the atmosphere.

The following cleaning steps are initially undertaken:

1(a). Dip them in concentrated nitric acid and heat the nitric acid bath to 100°–110° C. for approximately 4 to 6 hours. Cover the bath with a glass cover having provision for escape of vapors.

1(b). Remove the Vycor™ porous glass, when clear, from the bath with the help of a glass rod and wash several times in distilled water.

1(c). Exchange the distilled water with absolute alcohol by dipping the articles in absolute alcohol solution for approximately 30 minutes.

1(d). Remove the glass articles from alcohol solution and place into a vacuum chamber to evacuate overnight or until the pressure drops to less than 20 millitorr.

Thereafter, the following steps are undertaken:

2. Expose freshly dried, clean Vycor™ to the vapors of platinum (II) hexafluoroacetylacetonate (hereinafter sometimes referred to as PtHFAA) CAS#65353-51-7 FW=609.22 preferably without exposure to air. This can be done by keeping 300 to 500 mg monomer in a glass petri dish in a feed chamber next to the cleaned Vycor™ glass articles which in turn are mounted onto fixtures (e.g. tubes onto rods). Make sure to make provision for uniform passage of monomeric vapors over the glass articles. Alternatively, the monomeric vapors may be bled into the chamber via control valves connecting a source vessel of PtHFAA.

3. In the case of the petri dish above, evacuate the vacuum system preferably to 20 millitorrs or less. Initially, the pressures will be high as vapors emanate from the PtHFAA powder.

4. In the case of Vycor™7930 hollow tubes, the glass membranes start turning yellow within one to two minutes. In some instances, a greater exposure is helpful, such as up to about ten minutes. Continue exposure for 4 to 5 hours or until all the tubes have become deep yellow in color. The final pressure will be 20–25 millitorrs approximately. Less exposure is appropriate for thinner platinized coatings, but care must be taken not to exposure the Vycor™ (or other materials) to atmospheric contaminants.

5. Release vacuum by Argon flushing.

6. In the case of tubes, mount the tubes onto mandrels or mounting assemblies which position them appropriately within the reactor. The reactor tube should be clean because deposited metal from prior exposures may interfere with the platinization process. Thus, disposable reactor tubes or sleeves covering the inside of a reactor vessel are useful.

7. The remaining Vycor™ tubes (minus monomer) can be left in the feed chamber. The remaining monomer should be stored in a desiccator or, in the case of a valved system, stored under conditions preventing evacuation and/or contamination. Other inert storage conditions will be acceptable and are well known in the art. Room temperature storage is possible, provided the Vycor™ articles are fully pre-exposed to PtHFAA. Less than full exposure (i.e., non-saturated conditions) will require re-exposure before platinization.

8. Evacuate the reactor system to 20 millitorrs. In a small reactor system with limited pumping capacity this may take 1 to 3 hours. In larger systems, it may take 10 to 30 minutes.

9. Position the RF capacitive electrodes. In this example, positioning of copper electrodes was at 9 cm from feed inlet reactor side, and 6 cm from feed outlet, with an inter-electrode gap of 16 cm.

10. Initiate flow of Argon into the reactor. In the example, a set point of 10 (20 SCCM $CH_4$ mass flow meter) corresponding to an absolute value of approximately 3.83 SCCM was chosen. The pressure was allowed to stabilize at 120–130 millitorrs in the feed chamber measurement. As is known in the art, the mass flow will need to be adjusted in larger reactors such that a comparable pressure is achieved in any given volume. The plasma energy density will also need to be considered so that an increased power input level suitable to match the larger mass of gaseous species is obtained.

11. Plasma flow is initiated, sometimes with the assistance of a corona discharge gun. The power input was set at 10 watts with zero reflected power.

12. The Argon plasma treatment is continued for 10 to 15 minutes. Depending on the power input level and the mass flow rate of Argon chosen, the pre-plasma glow pressure and the glow discharge pressure can be varied over a wide range 60–200 millitorrs. However, the lower pressures appear to result in less complete platinization and the higher energy and/or pressure levels result in excess heat with no noticeable improvements in final properties of the articles produced.

13. Ideally, the articles should be rotated or moved through the plasma in such a way as to help ensure uniform platinization over the exposed surfaces. After a bright shiny metallic surface is clearly evidenced, continue the glow treatment for another 5 minutes to help burn off residual unwanted carbon. When the interior of a tube is to be platinized as opposed to the outside, or where a layer of platinum is to be located at a specific depth in the wall of a tube or disc, etc., the techniques known in the art for "single side" or "counter flow" low pressure chemical vapor deposition (LPCVD) of silicon dioxide films from various silanes can be modified to obtain a controlled platinization layer or zone within the interior wall of the substrate tubing, for deposition at a specific location on or along the wall. It is to be noted that the techniques of the present invention permit procedures to move forward under room temperature conditions, it being noted that commonly available techniques require the operations to be undertaken with components that are held at elevated temperatures.

14. Upon achieving the degree of platinization desired, the power is shut off and the system is vented against Argon.

15(a). Alternatively, the articles may be sequentially coated first via this platinization process, and then with a subsequent plasma polymerized coating of monomers such as propylene or siloxanes or silanes, either gaseous or liquid silanes may be employed, as well as organo-functional silanes or siloxanes. Also, fluorine containing monomers and organometallic monomers may be used. They may be in solid, liquid or gaseous forms, so long as they are vaporizable.

15(b). When the articles are to be over-coated with another plasma polymer layer such as siloxane, a good insulating layer can be achieved on top of the platinum conductive layer. The siloxane layer is also a good semi-permeable membrane layer which will allow the design of localized and controlled gas and/or chemical reactions to occur which combine the benefits of semi-permeable membranes with catalytic functionality.

15(c). Propylene monomers can also result in semi-permeable membrane overcoat layers and prior art has taught that plasma propylene membranes on top of platinum offer certain benefits for usage as electrodes, especially in hostile environments or for biomedical applications.

15(d). Various other copolymers and other plasma polymers known in the art can also be envisaged to be useful in selecting the rate of transfer of gases and/or chemicals to the platinum layer.

16. When the platinization of porous Vycor™ is complete, i.e., when the preferred pre-exposure to organic vapors is followed by the preferred level of Argon treatment, the resulting platinum article has a resistance of only 30–500 ohms per cm. In certain circumstances, platinum articles having a lower resistance may be prepared. This resistance value indicates that the platinum is interconnected, yet the micropores in the Vycor™ substrate remain intact throughout the metallized articles. By controlling the exposure time to the original monomer vapors one should be able to vary the amount of platinum deposition, as well as the pore sizes. The high surface area metallized membrane of the present invention can be used for catalytic conversions and separations. Reactions, such as oxidation, reduction, hydrogenation and other metal catalyzed reactions may be carried out with great ease by use of these metallized membranes.

17. By adding monomers such as propylene during or after first platinizing the articles, one can also envisage forming new platinum complexes for catalysis in chemical and biomedical applications.

By coating the platinum membrane with insulating coatings of silicon, fluoro or other such polymers or copolymers, one can envisage stable thin film conductors useful for electric current transmission.

The present invention further contemplates a method of controlling the amount of platinization and conductivity applied to respective substrates by exposing the substrates to precursor materials for varying amounts of time prior to plasma polymerization.

In other embodiments of the present invention, portions of the substrates may be masked prior to the plasma polymerization process, thereby causing only the exposed substrate areas to become polymerized. Examples of such masking techniques include masking the substrates in parallel ring patterns, and masking in longitudinal strips extending along length of the respective substrates. Various other masking patterns may be implemented as desired. Such substrates having specific polymerized areas may serve as ring electrodes or other various electro-catalytic elements. Other embodiments include strip arrays, strip electrodes, and various other applications.

SPECIFIC EXAMPLES

The following specific examples are given in order to set forth the various parameters that may be utilized and exercised in carrying out the various steps of the present invention.

Example 1

The following procedure was undertaken to form a platinum surface on a porous Vycor glass membrane:
OBJECTIVE: Platinize a porous Vycor glass membrane
PLASMA CONDITIONS: $O_2$ Plasma employed 15 minutes @ 15 watts, followed by 8 minutes @ 50 watts
REACTOR TUBE: 1" diameter×12" long
RESULTING 200–300 ohms or 32 ohms/cm
CONDUCTIVITY:
PRESSURE 94.8/14.1 mtorr—preglow
RANGE: 107/19.5 mtorr—during preglow
CAPACITIVE COUPLED ELECTRODES: copper bands
SAMPLE LENGTH: 3 inches
PLATINUM COMPOUND: Platinum (II) hexafluoroacetylacetonate.
METHOD OF EXPOSURE: Exposed via chemical vapor infiltration at 10 mtorr for 2 hours
SUBSTRATE: Vycor porous glass membrane from Corning #7930 Pore size: 40 Å Tubular: 7 mmID×1.1 mm wall Composition: $SiO_2$=96%, and $B_2O_3$=3%, Other: 1%
RESULTS: The resultant platinum surface displayed a resistivity of between 200 and 300 ohms over a 3" length, or 32 ohms/cm. Upon analysis, the platinum content at the surface was 39.7% with surface balance being carbon and oxygen.

Example 2

The following procedure was undertaken to platinize a porous Vycor glass membrane tube.
OBJECTIVE: Platinize porous Vycor glass membrane tube
PLASMA CONDITIONS: Argon Plasma (3.835 ccm) 10 minutes @10 watts
REACTOR TUBE: Same as in Example 1 above.

RESULTING
CONDUCTIVITY: 30 ohm/cm
PRESSURE RANGE: (mtorr) 126/19.3 preglow 138.7/26.7] glowing pressure range to 143.1/28.9]
CAPACITIVE COUPLED ELECTRODES: copper bands
SAMPLE LENGTH: 3½ inches long
PLATINUM COMPOUND: Platinum (II) hexafluoracetylacetonate
METHOD OF EXPOSURE: AMT Chemical vapor infiltration
SUBSTRATE: Porous Vycor Glass Membrane #7930 Pore Size: 40 Å 7 mmID×1.1 mm wall
RESULTS: 26.8% platinum measured at surface, balance carbon and oxygen. Upon depth analysis at 100 Å, the surface there was 100% platinum with the interface with the glass substrate being at about 300 Å. Further analysis demonstrated the presence of platinum down to at least 700 Å into the substrate pores. The platinum in depth, is usually metallic with carbon being present in the top 25 Å and with a slight amount of carbon at 300 Å.

Example 3

OBJECTIVE: Platinize a porous glass membrane coated on exterior with silicone membrane
PLASMA CONDITIONS: Argon plasma 15 minutes @ 10 watts
STEP A PLATINIZE
    CONDUCTIVITY: Inside or base layer, i.e., under the post-formed silicone layer: 70 Ωcm., with non-conductive silicone layer on top as overcoat
    REACTOR TUBE: same size as Example 1 above.
    PRESSURES: 125.6/20.5 mtorr preglow 138–145/27.7–31.6 glow (mtorr)
    CAPCITATIVELY COUPLED ELECTRODES: ring bands copper
    SAMPLE SIZE: 3 inches long
    PLATINUM COMPOUND: Platinum (II) hexafluoracetylacetonate
    SUBSTRATE PORE SIZE: 40 Å
STEP B SILICONE OVERCOAT
    NB: Coat platinized layer or membrane with a silicone film overcoat. In this step, tetramethyldisiloxane monomer plasma was polymerized onto the exterior surface of the platinized layer.
    PRESSURE: Maintained at 63.7–70.5/11.8–15.7 (mtorr)
    POWER: 5 watts
    REACTOR TUBE: Same as in Step A of this example
RESULTS:
A completely insulative silicone surface was formed over the platinized layer, with the platinum exhibiting a conductivity of about 70 ohms/cm. The silicone layer turns the overall composite into a semi-permeable composite membrane. The platinized porous Vycor gas permeation properties were excellent. Upon undergoing ESCA analysis, the composition of the composite film was determined to be 13.1% platinum and 16.5% silicone, balance primarily carbon and oxygen.
COMMENTARY
This type of membrane provides a capability to combine semi-permeable silicone properties with effective platinization films. The use of silicone permits selective extraction of gases, VOC's, or chemicals from fluids and/or gases. Chemical reactions with selective components may be achieved with the resultant composite a porous layer functioning in a catalytic fashion. Additionally, the platinized layer may be utilized to heat up and/or regenerate the silicone layer. Additionally, the electrical conductivity of the platinized layer may be utilized to influence absorption rates. As a catalyst, the composite may be utilized to perform reactions and extract components through the silicone layer either through pressure drop or liquid extraction operations.

Example 4

OBJECTIVE: Platinize a porous Vycor glass membrane tube 3½ " long
PLASMA CONDITIONS: Argon plasma 15 Minutes RF 10 Watts
REACTOR TUBE: Same as Example 1 above.
CONDUCTIVITY: 6 ohm/cm (i.e., very conductive)
PRESSURE USED: 121.4/20.3 preglow (mtorr) 125–137/22–28 mtorr during glow
SAMPLE LENGTH: 3 inches long
PLATINUM COMPOUND: Platinum (II) hexafluoracetylacetonate
METHOD OF EXPOSURE: Vapor exposure for one hour
SAMEEXPERIMENTAL SET-UP: As in Example 1.
RESULTS: # A highly conductive platinum film resulted with a resistance of only 6 ohms/cm. An ESCA analysis indicated platinum present in the amount of 23.5% at the surface with carbon and oxygen comprising the balance. With depth, the platinum concentration reached 100%, and the ESCA analysis indicated the surface carbon layer was very thin. Surface contamination, if present, may be etched off with the plasma, but results indicate that the surface contamination does not appear to interfere with conductivity.

Example 5

Objective: Use of alternate platinum precursor compound for platinization of Vycor glass. Used: (Trimethyl) methylcyclopentadienyl platinum (IV) (CAS No. 94442-22-5; FW-319.32). Exposure under vacuum overnight.
Plasma Conditions: Same reactor setup as in Example 2 above.
Resulting Conductivity: 78 ohms/cm, 3-inch sample.
Pressure Range: 89/19 preglow (mtorr) 105/82 glow (mtorr)
Platinum Compound: (Trimethyl)methylcyclopentadienyl platinum (IV) (CAS No. 94442-22-5; FW-319.32).
Substrate: Porous Vycor glass tubes (#7930, pore size 40 Å)
Results: Surface 30.4% platinum metal, higher content with depth.

Example 6

Objective: Gold metallization of porous Vycor membrane disc.
Plasma conditions: Argon plasma.
Substrate: Corning porous Vycor membrane disc.
Product Code: 7930 Vycor.
Pore Size: 40 Angstroms –45 Å.
Substrate Size: ¼" diameter discs, 0.125" thick.
Coating: Dimethyl(acetylacetonate) Gold (III) available from Strem Chemicals $(CH_3)_2$ $(C_5H_7O_2)$ $A\mu$ White Powder (CAS #14951-50-9; FW-326.60).
Reactor: One inch tubular reactor similar to Example 2 except length was 36" with capacitive coupled electrodes.
Exposure: Placed Vycor disc into vacuum with gold powder at 7 mtorr. Yellowing noticed after one hour. Left overnight under vacuum for convenience. In morning, disc very black in appearance.
Pressure: Preglow set at 127/20 mtorr;
    during glow 130/20 mtorr.

Power: RF 20 watts/35 minutes.
Results: Gold appearance very striking after only two minutes into Argon treatment. Disc removed after 35 minutes. Very shiny, uniform gold appearance over entire disc and inside the interior.
Conductivity Measured: Only one ohm of resistance/cm.
ESCA Analysis: Gold in metallic state. Concentration 36.3% on surface increases to almost 70% between 100–200 Angstroms with slow decline in depth of substrate. Still 20% at 700 Angstroms deep. Glass interface appears at about 400 Angstroms deep.
Other Notes: Very stable metallization. Conductivity same after six months. Also stable in air, and water, and methanol.

Example 7

Objective: Alloy, co-depositing copper and platinum. A two step process of first exposure to copper, then to the platinum yielded no results.
Compounds: CuHFAA and PtHFAA co-exposed. (Copper-Strem Catalog No. 28-2929; CAS No. 14781-45-4; FW-477.64).
Substrate: 2" PVG tubes (cleaned in nitric acid).
Reactor System: Tubular reactor 4" ID×36" long with capacitively coupled electrodes; samples mounted vertically.
Argon Gas: Plasma treatment after co-exposure to copper (copper (11) hexafluoroacetylacetonate) and platinum organometallic vapors under vacuum for 3 hours.
Exposure Time to Plasma: 32 minutes. Appearance was metallic after 15 minutes.
Power: 10 Watts.
Pressure: Varied 120/60 mtorr (typical).
Results: Uniform looking, shiny metal coating; resistance—80–100 ohms (2"); or 150 ohms/cm.
ESCA Analysis: Platinum, copper alloy; Platinum about 50%, copper about 3 to 4% for depth of 500 Å, balance being glass with carbon only at the surface.

Example 8

Objective: A two-step exposure method—alloy platinum/palladium.
Substrates: Corning 7930 PVG membrane; 7 mm ID tubes.
Coating Precursors: PtHFAA powder (Strem Chemicals) and Palladium(II) Trifluoroacetate. Pd(O$_2$CCF$_3$) Strem Catalog No. 46-0280; CAS No. 42196-31-6; FW-332.44.
Reactor Used: Same as in Example 7 above.
Exposure: The membrane tubes were first exposed to palladium(II) trichloroacetate vapors for 2½ hours. Subsequently exposed to PtHFAA vapors for 2 hours.
Reaction Pressures: 64/23 mtorr preglow; 79/64 mtorr during glow.
Argon Plasma: at 10 Watts RF.
Reaction lasted: 20 minutes.
Results: Membrane looked metallic, silvery color after 7 minutes of the reaction.
Conductivity: Resistance measured: (a) 15 ohms/cm on surface; (b) 10 ohms through membrane wall of 1.1 mm. A very uniform bright coating.

Example 9

Objective: Co-exposure method; alloy palladium/platinum.
Substrate: Corning PVG membrane tubes; 7 mm ID, 1.1 mm wall.
Coating Precursors:
(1) PtHFAA;
(2) Palladium(II) Trifluoroacetate (42196-31-6; FW-332.44);
(3) Palladium(II) Acetylacetonate (CAS #14024-61-4; FW-304.62); and
(4) Pd (C$_5$H$_7$O$_2$)2 (Strem Catalog No. 46,1800).
Reactor Used: Same as Example 8.
Exposure Method: All three organometallic compounds were exposed to the PVG membrane tubes at the same time for two hours and 15 minutes. Samples became very yellow.
Reaction Pressures:
113/23 preglow (mtorr)
123/33 during glow (mtorr).
Argon plasma at 10 watts RF.
Results: Bright metallic coating on tubes but not uniform around circumference. Them membrane may need to be rotated for uniformity.
Conductivity: Measured resistance:
(1) 100 ohms/cm on the metallic coating;
(2) 3 to 5k ohms on the duller coating areas.

Example 10

Objective: Coating copper tin alloys into PVG membranes
Substrate: Corning 7930 PVG membrane tubes with 7 mm ID.
Coating Precursors: PtHFAA powder and copper (II) Trifluoroacetylacetonate Cu (CF$_3$COCHCOCH$_3$)2–97% (purity), from Strem Catalog No. 29-5000). (CAS No. 14324-82-4; FW-369.70). Balance of copper compound appears to have been tin (Sn) as an impurity in the copper precursor.
Reactor Used: Same as in Example 7.
Exposure: The tubes were co-exposed to the platinum and copper (tin) vapors, i.e., at the same time. This co-exposure lasted for 2½ hours, after which time the tubes appeared dark green.
Reaction Pressures: 89/43 both pre-glow and during glow (mtorr).
Argon plasma used: at 20 Watts RF.
Reaction Lasted: 35 minutes.
Results: ESCA analysis revealed the samples to contain 13% of platinum, and 5.16% of tin and 1.25% of copper on the surface. It is speculated that the tin is more readily incorporated into forming an alloyed structure than the copper used in this example.
Conductivity: Measured resistance of 10 k ohms over 3" or 1.3 k ohms/cm.
Appearance: A dark brown shiny, metallic finish.

Example 11

Objective: Platinize ceramic membrane disc.
Substrate: Anotec aluminum oxide disc pore size 0.025 micron membrane disc (for filtration typically). Product Code 0250475—Anapore™ membrane.
Platinum compound: Exposed PtHFAA vapors—1 hour and 45 minutes.
Reactor Setup: Same as Example 7 above.
Argon plasma: used.
Exposure time to plasma: 35 minutes.
Power: 20 watts RF.
Pressure: 85/40 mtorr.
Results: Turned from white to shiny gray and silvery color.
Conductivity: Measures 10 (mega) ohms/cm. Thus some conductivity being added to ceramic membrane—optimization not completed but shows the capability to platinize aluminum oxide membranes, etc.

Example 12

Objective: Platinize silica aerogels.
Substrate: Thermalux silica aerogel. See U.S. Pat. No. 5,156,895 and defined in U.S. Pat. No. 4,610,863 and U.S. Pat. No. 4,667,417. A one-inch square silica aerogel, ½ inch thick was obtained from Thermalux Corporation of California, USA.
Coating Precursor: PtHFAA used from Strem Chemicals.
Reactor used: A 1"×36" glass tubular reactor.
Exposure method: The silica aerogel was mounted next to a small sample vial of PtHFAA powder under vacuum for two hours.
Reaction pressures:
  122/25.0 mtorr pre-glow;
  124.3/26.0 mtorr during glow.
Argon plasma used: At 50 Watts for 40 minutes (RF).
Results: A platinum silver coating was formed on the outermost surface and pores of the silica aerogel. The sample is still transparent and slightly yellow inside, but reflects light on the entire surface of the 1" square and its sides. It is speculated that optimization of platinization of silica aerogel materials will involve placement of the sample directly in the Argon glow along with rotation of the material to be platinized. These structures will offer interesting opportunities for electro-catalysis due to their high porosity and large specific surface areas.

Example 13

Objective: Platinize CPG porous glass beads.
Substrates: 75 Å pore sized CPG (controlled porous glass) typically used in chromatography (also 1,021 Å beads).
Exposed to: PtHFAA vapors for 2 hours under vacuum.
Reactor: Same setup as in Example 7 above.
Argon plasma: used.
Pressures: 87/42 (mtorr) (inlet/outlet).
Power: 20 Watts.
Reaction time: 36 minutes.
Results: The 75 Å beads readily platinized in 3 to 10 minutes. The 1,021 Å beads were less noticeably platinized so the reaction was continued for the entire 36 minute period.
ESCA Analysis: 75 Å beads showed 36.4% platinum content; platinum in metallic state; noted beads very shiny, reflect light like diamonds.

Example 14

Objective: Platinize CPG beads.
Substrates: CPG, Inc. of Lincoln Park, N.J. porous glass beads used for chromatography; pore sizes: 75 Å; 130 Å; 477 Å; and 1,021 Å.

| Product No. | Lot # | Pore Size | Mesh Size |
|---|---|---|---|
| CPG 1000D | 08D014 | 1021 Å | 20/80 |
| CPG 00500D | 06D018 | 477 Å | 20/80 |
| CPG 00120D | 02D005 | 130 Å | 20/80 |
| CPG 00075D | 01D005 | 75 Å | 20/80 |

Exposure: to PtHFAA vapors for 1 hour and 45 minutes under vacuum.
Reactor: Same as in Example 7 above.
Argon plasma used.
Pressures: 87/42 (mtorr).
Power: 20 Watts.
Reaction time: 35 minutes.

| Results: | ESCA Analysis | Platinum Content |
|---|---|---|
| | Beads 75 Å | 18.0% |
| | Beads 130 Å | 14.8% |
| | Beads 477 Å | 4.66% |
| | Beads 1,021 Å | 2.82%. |

Note: It was noted that the only difference between Examples 13 and Example 14 with regards to the 75 Å beads was the placement of the electrode positions. Based upon this result (36% platinum versus 18%) it is deemed preferable to place the articles to be platinized in front of or under the hot electrodes but not past the hot electrode position.

Example 15

Objective: Platinization PVG with hydrogen plasma (optional gas).
Substrate: Two porous Vycor glass tubes (2" long each) were cleaned with sodium hypochlorite. Samples were then exposed to PtHFAA vapors under vacuum for 2½ hours. Hydrogen gas used for plasma treatment.
Reactor Used: A tubular reactor 4" ID×36" long with capacitively coupled electrodes. Samples were mounted vertically.
Pressure: 55/40 mtorr.
Exposure: RF power at 20 Watts.
Time: 20 minutes.
Results: Both tubes platinized; conductivity about 700 ohms over entire 2" length or 138 ohms/cm. Not as uniform appearance nor as conductive as Argon plasma results.

Example 16

Objective: Platinize Asahi glass microfilter membranes, 1,000 Å pores.
Substrates: Glass tubular membranes purchased from Mihama Corp. of Japan. Commercially manufactured by ISE Chemicals Corp. of Japan (developed by Asahi Glass Co. Ltd.). Product Code MPG-NAI, 10 mm OD, pore size=1,000 Å.
Platinum compound: PtHFAA.
Argon plasma and oxygen plasma used.
Step (A): Using Argon plasma after overnight exposure to PtHFAA vapors (overnight for convenience only).
  Sample: Asahi tube 2" long, 10 mm OD×1 mm wall.
  Pressures used:
    108/19 (mtorr) pre-glow;
    133/45 (mtorr) glow.
  The Asahi membrane began to turn dark in color after only 4 minutes of exposure at power RF of 10 Watts. Power was increased to 20 Watts and pressure increased to 191/60 (mtorr). Another six minutes of reaction time for 14 minutes in total.
  Results (Step A): Appearance machine gray outside and inside porous glass tube membrane. Resistance measured only 120 Kohm over 2" length. Uniform coating. Platinum black coating likely.
Step (B): Resultant membrane and reactor set up reloaded. Various pressures and power levels tried to increase platinization activity using Argon. Then oxygen plasma tried for 20 minutes at 10–50 Watt range on the previously treated sample.
  Results: Still dark in appearance, but shiny (138 ohms/cm). Also resistance dropped to 700 ohms, i.e., down from 120 Kohms of Step (A) above.

Conductivity: Measured only 200 ohms through the wall of membranes. Gas and water flux measurements indicated no significant changes in properties after platinization thus, an electro-conductive microfilter of glass has been created.

ESCA Analysis: 40% platinum in top structure of the Asahi porous glass membrane. Unlike the smaller pored Corning PVG this membrane's platinization is higher at the surface and slowly decreases to about 14% at 400 Å and appears to increase again as the inner diameter profile is reached This is assumed to be a result of the more porous nature of this substrate (carbon only at surface).

Example 17

Objective: Platinize Asahi glass tubular membranes (porous 1,000 Å).

Substrates: Several substrates coated at the same time:

(A) Asahi membrane (as in Example 16) 2" long. Cleaned first with nitric acid procedure. Exposed to PtHFAA vapors per standard procedure for 1 hour and 45 minutes.

Reactor Setup: Same as in Example 7 above.

Argon plasma: only.

Pressure: Varied—130/80 (mtorr)(typical).

Power: Varied—50 to 75 Watts.

Time of Reaction: 24 minutes.

Results: Asahi membranes darkened quicker with higher power of 50–70 Watts versus 10–20 Watts of earlier examples or experiments. Larger pored substrates may react more readily at higher powers.

Resistance: Measured 10–15 Mohms through the membrane wall.

ESCA Analysis: Showed platinum metal about 22.5%.

(B) Porous glass beads were obtained from CPG, Inc. Pore sizes of 130 Å; 477 Å; and 1,021 Å were utilized in this example or experiment. Exposed to PtHFAA vapors along with the Asahi glass membrane substrate for 1 hour and 45 minutes.

Reactor Setup: Same as Example 7 above.

Argon plasma used.

Pressure: Varied—130/80 (mtorr) typical.

Power: Varied—50 to 75 Watts.

Time: 24 minutes.

Results: All the beads became platinized to some extent with the smaller pore sized beads having the most platinum metal content according to ESCA analysis.
130 Å=14.3%
477 Å=3.6%
1,021 Å=3.36%.

It is noted that the beads were kept stationary in a petri dish with those on the bottom less exposed to the reaction. This lowers the average platinum concentration for ESCA. A tumbler should allow more uniform results and high overall platinum content.

Example 18

Objective: Platinize inner lumen of PVG membrane tubes.

Substrates: Procedures and experimental apparatus were identical to those described in Example 17 except that the Corning 7930 PVG membranes were mounted vertically onto mandrels which had a metallic coating on top of the glass mandrel applied as in Example 1 above.

Method: This metal liner appeared to bias the platinization reaction preferentially to the interior of the 7 mm diameter membranes.

Results: (1) ESCA analysis of the interior lumen of the membrane wall reveals 38% platinum metal. (2) A very shiny silver platinum surface on the interior. (3) Resistance measured only 30 ohms/cm on the interior.

Example 19

Objective: Controlled platinization of porous Vycor glass membrane tubes.

Substrates: Corning 7930 PVG membranes; 7 mm I.D. tubes.

Reactor system: Tubular reactor 4"I.D.×36" long with capacitively coupled electrodes; samples mounted vertically.

Pressure used: 81/41 mtorr Argon.

Platinum compound: PtHFAA vapors

Exposure time to plasma: 10 minutes

Power: 40 Watts

Samples: 2 Vycor membranes exposed for 15 minutes, 2 Vycor membranes exposed for 30 minutes, 2 Vycor membranes exposed for 1 hour, and 2 Vycor membranes exposed for 3 hours, prior to plasma polymerization.

Results: Membranes exposed for 15 minutes to PT HFAA vapors prior to plasma polymerization display a resistance of about 0.7 Mohms; the membranes exposed for 30 minutes displayed a resistance of 1380 ohms; membranes exposed for 1 hour displayed a resistance of 150 ohms; and membranes exposed for 3 hours displayed a resistance of 320 ohms. Such resistance change based upon varying exposure times demonstrates that the amount of platinization and conductivity can be variably controlled. In general, resistance is decreased with longer exposure time. After a certain period of exposure, however, the membranes may be negatively effected such that polymerized metals are destabilized on the membrane surface, thereby resulting in increased resistance. The critical time at which the final product is negatively effected depends upon the metal or metals used in the polymerization process.

Example 20

Objective: To apply platinum to substrate at specific locations in a controlled manner.

Substrates: Vycor 7930 porous glass membrane tubes; the membrane tubes were masked with tape so that only the exposed sections became converted to platinum metal. In one case, unmasked areas extend along lengths of the membrane tubes, and in a second case, unmasked areas encircle the membrane tubes.

Pressure used: 91/40 mtorr

Platinum compound: PtHFAA (Strem chemicals)

Exposure time to plasma: 5 minutes

Power: 20 Watts

Reactor system: Tubular reactor 4" I.D.×36" long with capacitively coupled electrodes; samples mounted vertically.

Results: The unmasked, exposed areas became platinized with high conductivity, as evidenced by sharply reduced resistance in the unmasked areas as compared to the masked areas (infinite resistance in the masked areas, 150 ohms in the unmasked areas). The masked areas show no metallization and no conductivity between the platinized, or unmasked areas.

Commentary: Such membranes having specific platinized areas may serve as ring electrodes or as various electro-catalytic elements. Advantages associated with such a procedure for creating electrodes in various forms will be obvious to those skilled in the art. Examples of various embodiments incorporating such a procedure include strip arrays, dot arrays, strip electrodes, ring electrodes, and various other applications.

Example 21

Objective: Coat platinized membrane with silicone membrane.
Plasma conditions: Argon plasma; 15 minutes
Power: 10 Watts
Step A: Platinize
  Reactor: 1" diameter×12" long
  Pressures: 125.6/20.5 mtorr preglow; 138–145/27.7–31.6 glow (mtorr)
  Platinum compound: Platinum (II) hexafluoroacetylacetonate
  Sample size: 3" long
Step B: Coat platinized membrane with a silicone membrane formed by plasma polymerized siloxanes.
  Pressure: Maintained at 63.7–70.5/11.8–15.7 (mtorr)
  Power: 5 Watts
  Results: A good insulating layer is achieved on top of the platinized conductive layer. The siloxane layer is also a good semi-permeable membrane layer which allows localized and controlled gas and/or chemical reactions to occur which combine the benefits of semi-permeable membranes with catalytic functionality.

Example 22

Objective: Coat platinized Vycor membrane with a semi-permeable fluoropolymer layer.
Substrates: Corning Vycor 7930 platinized per process and 1 microglass slide.
Pressure used: 29/10 mtorr using hexafluoroethane monomer.
Platinum compound: PtHFAA
Exposure time to plasma: 6 minutes
Power: 100 Watts
Reactor system: Tubular reactor 4" I.D.×36" long with capacitively coupled electrodes; samples mounted vertically.
Results: The fluoropolymer coating on the platinized Vycor membrane forms with consistency and good coverage. Water contact angle on the glass slide over 90 degrees and ESCA analysis indicates such fluoropolymer composition. Such a fluoropolymer coating forms a thin film conductor over the platinized Vycor membrane, which is useful for electric current transmission.

Example 23

Experiment (A)

Objective: Coat platinized Vycor porous glass membrane with propylene membrane layer.
Substrate: Vycor 7930 porous glass membrane tube and glass slide
Pressure used: 62/20 mtorr
Platinum compound: PT HFAA vapors
Power: 100 watts
Reactor used: Tubular reactor 4" I.D.×36" long with capacitively coupled electrodes; samples mounted vertically.
Results: After standard platinization process, samples were exposed to propylene plasma for 6 minutes. The Vycor membrane tubes were coated with a slightly dark propylene coating, as further evidenced by ESCA and IR analysis of the glass slide which was coated at the same time.

Experiment (B)

Objective: Propylene monomer as a supporting gas for platinization (noble metallization process) to obtain a metal/propylene complex.
Substrate: Vycor 7930 porous glass membrane tubes and glass slide exposed to PtHFAA vapors and propylene supporting monomer gas during same reaction.
Pressure used: 31/20 mtorr
Platinum compound: PtHFAA vapors followed by propylene plasma coating
Exposure time: 6 minutes
Power: 100 Watts
Reactor system: Same
Results: Propylene monomer was used to initiate the platinization process. The Vycor membrane tube was coated with a slightly dark organometallic brown coating. As opposed to the platinization process alone, the organometallic brown coating was not shiny. The material is likely a propylene platinum complex.

Example 24

Objective: To plasma polymerize titanium ethoxide onto porous glass substrates, or platinum-coated porous glass substrates.
Substrates: Corning 7930 PVG membrane tubes, 7 mm ID.
Coating Precursors: Titanium ethoxide
Pressure used: 92/44 mtorr
Exposure time: 17 minutes
Power: 50 Watts p0 Reactor system: Tubular reactor 4" I.D.×36" long with capacitively coupled electrodes; samples mounted vertically.
Monomer feed: Titanium ethoxide vapor fed at 110 millitorr for 4 minutes followed by Argon gas supporting plasma.
Results: A light yellow titanium dioxide coating was formed on top of the substrate. The samples were very stable after soaking in alcohol for 6 hours.

Other Parameters Related to Platinization

In connection with the platinization operation, the following parameters may be considered:

A. Higher wattage of Argon leads to heating up of the reactor tube with no known advantage at this time.

B. Higher Argon pressure slows down the platinization process.

C. Oxygen plasma can lead to platinization but sputtering occurs simultaneously leading to imperfect films. Oxygen plasma does yield slightly different final chemistry in the coatings which may be advantageous in some applications.

D. Inert gases other than Argon may be employed such as, for example, krypton, Xenon, helium, or nitrogen. Optionally, hydrogen may be employed in certain instances, and certain gaseous fluorocarbons may be utilized as well.

E. The exposure time determines the thickness and appearance of platinum coating. Lower exposure may result in a non-shiny platinum coating which is still porous and may have potential applications. However, care should be taken not to expose semi-exposed articles to contaminating vapors prior to platinization.

F. The exposed tube may turn brownish on long standing in feed chamber because of interaction with chamber impurities. These impurities polymerize under Argon plasma to form a polymer coating on the surface which prevents platinization process. High Argon plasma wattage may be required to remove these impurities, but coatings never achieve good conductivity. Preferably, exposure of the tubes to the monomer prior to platinization is generally preferred.

With reference to the advantages which flow from products prepared in accordance with the present invention, and with regard to catalytic applications, it is generally recognized that the level of activity of a given catalyst is a function of the size and structure of the particles comprising the catalyst. The smaller particle size enhances the activity level. The utilization of the application techniques of the present invention increase the ability to coat a wider variety of porous media. This enhanced ability, in turn, provides flexibility for selection of structural features and/or configurations, as well as materials of construction. Furthermore, the coating techniques of the present invention is effective at lower temperatures than required for conventional treatments, and thus, the techniques are found to create fewer stresses in the substrate material as well as in the catalysts, thereby reducing the extent and degree of any distortions. These lower temperatures further enhance the stability of the particulate, and thus enhance the ability of the particulate to remain anchored in place. By way of example, colloidal materials generally form aggregates or agglomerates, and hence their activity level is decreased.

Selection of Materials and Their Applications
(A) Metals, Alloys and Additive Materials The techniques of the present invention enable the preparation of coatings or metallic films which comprise alloys, multilayered composites of noble metals, metal/organic compounds, as well as other complex structures. Post-coating film treatments may include both complexation, as well as electroplating.

By way of example, combinations such as platinum/tin, and platinum copper alloys may be successfully formed as films in and upon porous glass membranes.

In a further example of useful applications, a film of gold may be superimposed upon a platinum film through the techniques of the present invention employing separate applications of these two materials.

In a still further embodiment, various organic compounds in vapor form may be added, including organic moieties which can be incorporated directly into the metallic film. For example, a propylene gas may be utilized as a support for the plasma, along with the use of varying power levels and pressures during plasma treatment which will affect the composition of the resulting composites.

In a still further embodiment, after forming a platinum film on the interior surface of a porous substrate, an additional layer in the form of a protective film or the like may be provided to form a complex structure. In this connection, a silicone layer may be added by way of plasma so as to form a semi-permeable membrane to selectively remove components from gas or liquid fluids, which then make contact with catalytic pores to undergo a reaction. Additionally, known techniques for initiating various reactions such as reactions which are accelerated or supported by heat, electrical fields, or radiant energy.

Consideration may also be given to the addition of a UV absorbing or reflective coating, such as titanium dioxide to be added to or superimposed upon the platinum coated substrate. Composite films of platinum and titanium dioxide may be utilized to provide more effective photocatalysis as well as other photoresponsive applications when used in combination. Conventional plasma polymerization may be utilized to form the superimposed layer of titanium dioxide. These composites may further be provided with a silicone membrane when appropriate.

As a still further example, after forming a film of platinum and/or gold on and in a porous substrate (or alloys, multilayered metal composites, or metal-organic compounds), one can use any of the well known techniques in the art to form chemical complexes. Platinum and platinum-group metal complexes are known, and have been found useful in a variety of fields. Platinum and gold complexes are of increasing importance for medical diagnostic applications and operations, and bio-affinity applications such as genosensors, DNA probes, and biopurification and separation operations. These materials also find application in the synthesis of a variety of peptides. Other post-coating treatments can be utilized through conventional methods such as electroplating and the like, once the conductive metal coating has been applied onto the originally electrically insulative or non-conductive plate.

A wide variety of substrates may be employed, including various types of membranes including beads, fibers, or aerogels. By providing the metallic layers, additional properties and characteristics are provided to the material such as conductivity, catalysis, bio-affinity, and capacitive properties. Glass ultrafilter membrane may be treated by the process of the present invention to add electro-conductivity to provide an electro-conductive ultrafilter. Certain other suitable substrates include microfilters, reverse osmosis membranes, as well as gas permeable membranes.

(B) Substrates

The methods and techniques of the present invention are applicable to a wide variety of substrate materials. Such materials include the following:
1) porous glass membranes (plastic)
2) porous glass beads
3) porous silica catalysts, molecular sieves
4) porous ceramics
5) porous plastics
6) porous optics
7) porous silicon
8) aerogels, xerogels
9) non-porous plastic, glass rubbers.

Membranes may be coated onto the present invention when based upon substrates such as the following:
Porous glass;
Zeolite type membranes (mol. sieves);
Silicon carbide;
Inorganic oxides;
Multioxide supports;
Ultra microporous silica;
Titanium dioxide.

The process is effective for application of the noble metals and alloys thereof, with thorough and substantially complete coverage of the substrate being obtained.

(C) Coatings

The technique of the present invention is further applicable to combination with other plasma coatings. For example, the steps of the present invention may be employed in the following sequence:
(A)
Step One—Metallize platinum;
Step Two—Metallize gold;
(B)
Step One—Metallize platinum;
Step Two—Plasma organic polymer;
(C)
Step One—Metallize platinum;
Step Two—Plasma UV coatings or photocatalysts such as titanium dioxide.

The two-step processes or methods set forth above are utilized to form nanocomposites.

The methods and techniques of the present invention are also applicable to multiple-step operations which include the following:

Method (A)—platinize then form complex;
Method (B)—gold coat followed by complexation;
Method (C)—Platinize/gold coat then attach biological probes, enzymes, and the like.

Multiple-step operations may be utilized as well.

It will be appreciated that various modifications in the process may be undertaken without departing from the spirit and scope of the invention.

What is claimed is:

1. The method of preparing continuous thin films of noble metal blends upon porous substrate surfaces utilizing plasma polymerization which includes the steps of:
   (a) selecting a porous electrically insulative substrate and mounting the substrate within a reaction chamber housing a plasma reactor;
   (b) selecting a blend of monomer or comonomer precursors, wherein the metals in the blend are selected from the group consisting of platinum, palladium, gold, copper, and tin;
   (c) providing a pair of spaced apart electrodes within said reaction chamber in a configuration for creating a plasma glow reaction within said reaction chamber;
   (d) applying RF energy across said electrodes to create a plasma glow zone therebetween;
   (e) maintaining said plasma glow while simultaneously supporting said plasma glow through the introduction of a plasma supporting gas in the presence of said blend of monomer or comonomer precursor within said reaction zone with the continuation of said plasma glow causing said precursor to convert to dissociated form so as to release said selected noble metals from said precursor to form a component consisting essentially of a layer of said selected noble metals and thereby deposit said selected noble metals component in elemental form as a film of said selected noble metals onto the surface of said substrate.

2. A method as in claim 1 wherein said noble metals are selected from the group consisting of platinum, palladium, gold, copper, and tin.

3. A method as in claim 1 wherein the substrate is substantially continuously moved so as to level the film thereon.

4. A method as in claim 1 wherein the plasma reactor is tubular.

5. A method as in claim 1 wherein the electrodes are moved substantially continuously to level the film thereon.

6. A method as in claim 1 wherein said precursor is selected from the group consisting of platinum, hexafluoroacetylacetonate, copper hexafluoroacetylacetonate, palladium hexafluoroacetylacetonate, (trimethyl) methylcyclopentadienyl platinum, dymethyl (acetylacetonate) gold, and titanium ethoxide.

7. A method as in claim 1 wherein said precursor is continuously added to said reaction zone.

8. A method as in claim 1 wherein said RF energy is delivered at a frequency of substantially 13.56 MHz.

9. A method as in claim 1 wherein a magnetic field is added across said reaction zone.

10. A method as in claim 1, including the step of exposing said porous electrically insulative substrate to said precursor for varying amounts of time prior to applying said RF energy across said electrodes.

11. A method as in claim 10 wherein metallization and conductivity is dictated by the length of time that said substrate is exposed to said precursor prior to applying said RF energy.

12. A method as in claim 1, including the step of masking portions of said substrate prior to mounting the substrate within said reaction chamber.

13. A method as in claim 1, including the step of applying an insulative layer on said selected noble metal film.

14. A method as in claim 13 wherein said insulative layer comprises silicone.

15. A method as in claim 1, including the step of applying a semi-permeable membrane layer on said selected noble metal film.

16. A method as in claim 15 wherein said semi-permeable membrane layer comprises material selected from the group consisting of propylene, siloxanes, silanes, and fluorine.

17. A method as in claim 1, including the step of applying a fluoropolymer layer to said selected noble metal film.

18. A method as in claim 1 wherein said plasma supporting gas is selected from the group consisting of argon, krypton, xenon, helium, and nitrogen.

19. A method as in claim 1 wherein said plasma supporting gas is selected from the group consisting of oxygen, hydrogen, gaseous propylene monomer, and gaseous fluorocarbon compounds.

20. A method as in claim 1 wherein a propylene-metal complex is formed when said gaseous propylene monomer is used as said plasma supporting gas.

21. The method of preparing semi-continuous thin films of noble metal blends upon porous substrate surfaces utilizing plasma polymerization which includes the steps of:
   (a) selecting a porous electrically insulative substrate and mounting the substrate within a reaction chamber housing a plasma reactor;
   (b) selecting a blend of monomer or comonomer precursors, wherein the metals in the blend are selected from the group consisting of platinum, palladium, gold, copper, and tin;
   (c) providing a pair of spaced apart electrodes within said reaction chamber in a configuration for creating a plasma glow reaction within said reaction chamber;
   (d) applying RF energy across said electrodes to create a plasma glow zone therebetween;
   (e) maintaining said plasma glow while simultaneously supporting said plasma glow through the introduction of a plasma supporting gas in the presence of said blend of monomer or comonomer precursor within said reaction zone with the continuation of said plasma glow causing said precursor to convert to dissociated form so as to release said selected noble metals from said precursor to form a component consisting essentially of a layer of said selected noble metals and thereby deposit said selected noble metals component in elemental form as a film of said selected noble metals onto the surface of said substrate.

22. A method as in claim 21 wherein said noble metals are selected from the group consisting of platinum, palladium, gold, copper, and tin.

23. A method as in claim 21 wherein the substrate is substantially continuously moved so as to level the film thereon.

24. A method as in claim 21 wherein the plasma reactor is tubular.

25. A method as in claim 21 wherein the electrodes are moved substantially continuously to level the film thereon.

26. A method as in claim 21 wherein said precursor is selected from the group consisting of platinum, hexafluoracetylacetonate, copper hexafluoroacetylacetonate, palladium hexafluoroacetylacetonate, (trimethyl) methylcyclopentadienyl platinum, dymethyl (acetylacetonate) gold, and titanium ethoxide.

27. A method as in claim 21 wherein said precursor is continuously added to said reaction zone.

28. A method as in claim 21 wherein said RF energy is delivered at a frequency of substantially 13.56 MHz.

29. A method as in claim 21 wherein a magnetic field is added across said reaction zone.

30. A method as in claim 21, including the step of exposing said porous electrically insulative substrate to said precursor for varying amounts of time prior to applying said RF energy across said electrodes.

31. A method as in claim 30 wherein metallization and conductivity is dictated by the length of time that said substrate is exposed to said precursor prior to applying said RF energy.

32. A method as in claim 21, including the step of masking portions of said substrate prior to mounting the substrate within said reaction chamber.

33. A method as in claim 21, including the step of applying an insulative layer on said selected noble metal film.

34. A method as in claim 33 wherein said insulative layer comprises silicone.

35. A method as in claim 21, including the step of applying a semi-permeable membrane layer on said selected noble metal film.

36. A method as in claim 35 wherein said semi-permeable membrane layer comprises material selected from the group consisting of propylene, siloxanes, silanes, and fluorine.

37. A method as in claim 21, including the step of applying a fluoropolymer layer to said selected noble metal film.

38. A method as in claim 21 wherein said plasma supporting gas is selected from the group consisting of argon, krypton, xenon, helium, and nitrogen.

39. A method as in claim 21 wherein said plasma supporting gas is selected from the group consisting of oxygen, hydrogen, gaseous propylene monomer, and gaseous fluorocarbon compounds.

40. A method as in claim 39 wherein a propylene-metal complex is formed when said gaseous propylene monomer is used as said plasma supporting gas.

* * * * *

UNITED STATES PATENT AND TRADEMARK OFFICE
CERTIFICATE OF CORRECTION

PATENT NO.    : 6,426,126 B1
DATED         : July 30, 2002
INVENTOR(S)   : Stephen P. Conover and Ashok K. Sharma It is certified that error appears in the above-identified patent and that said Letters Patent is hereby corrected as shown below:

Column 9,
Example 8, under the heading "Exposure", "palladium (II) trichloroacetate" should read -- palladium trifluoroacetate --.

Column 19,
Lines 50 and 52, "copper hexafluoroacetylacetonate, palladium hexafluoroacetylacetonate" should read -- copper trifluoroacetylacetonate, palladium acetylacetonate --.

Column 20,
Line 67, "copper hexafluoroacetylacetonate, palladium hexafluoroacetylacetonate" should read -- copper trifluoroacetylacetonate, palladium acetylacetonate --.

Signed and Sealed this

Twenty-first Day of January, 2003

JAMES E. ROGAN
*Director of the United States Patent and Trademark Office*